United States Patent
Lee et al.

(10) Patent No.: US 11,250,924 B1
(45) Date of Patent: Feb. 15, 2022

(54) ONE-TIME PROGRAMMABLE (OTP) MEMORY CELL CIRCUITS EMPLOYING A DIODE CIRCUIT FOR AREA REDUCTION, AND RELATED OTP MEMORY CELL ARRAY CIRCUITS AND METHODS

(71) Applicant: QUALCOMM Incorporated, San Diego, CA (US)

(72) Inventors: Hochul Lee, Los Angeles, CA (US); Anil Chowdary Kota, San Diego, CA (US); Anne Srikanth, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/075,002

(22) Filed: Oct. 20, 2020

(51) Int. Cl.
  *G11C 17/00* (2006.01)
  *G11C 17/18* (2006.01)
  *G11C 17/16* (2006.01)

(52) U.S. Cl.
  CPC .............. *G11C 17/18* (2013.01); *G11C 17/16* (2013.01)

(58) Field of Classification Search
  CPC ................................ G11C 17/18; G11C 17/16
  USPC .......................................................... 365/96
  See application file for complete search history.

(56) References Cited

U.S. PATENT DOCUMENTS

| | | | |
|---|---|---|---|
| 7,136,322 | B2 | 11/2006 | Brennan et al. |
| 8,824,234 | B2 | 9/2014 | Lin et al. |
| 9,053,889 | B2 | 6/2015 | Kirihata et al. |
| 2003/0031047 | A1 | 2/2003 | Anthony et al. |
| 2011/0317468 | A1 | 12/2011 | Terzioglu |
| 2013/0063999 | A1 | 3/2013 | Agam et al. |
| 2013/0223124 | A1 | 8/2013 | Park et al. |
| 2016/0071582 | A1 | 3/2016 | Chung |
| 2017/0053705 | A1 | 2/2017 | Agarwal et al. |
| 2017/0117059 | A1 | 4/2017 | Yang |
| 2017/0125120 | A1 | 5/2017 | Yang |
| 2021/0125678 | A1* | 4/2021 | Cho .................. G11C 17/18 |

FOREIGN PATENT DOCUMENTS

KR       101762918 B1       7/2017

OTHER PUBLICATIONS

International Search Report and Written Opinion for International Patent Application No. PCT/US2021/049894, dated Dec. 23, 2021, 28 pages.

* cited by examiner

*Primary Examiner* — Huan Hoang
(74) *Attorney, Agent, or Firm* — QUALCOMM Incorporated

(57) ABSTRACT

An OTP memory cell circuit includes a read access switch coupled to a fuse in a read current path to allow a read current to flow through the fuse during a read operation. The read access switch, which can be shut off in a write operation, is sized according to the read current to reduce leakage currents that can cause unreliable results. A diode circuit coupled to a node between the read access switch and the fuse provides a write current path through the fuse different from the read current path in the OTP memory cell circuit. The diode circuit is configured to drive, through the write current path including the fuse, a write current sufficient to blow the fuse in a write operation. The diode circuit occupies a smaller area than a write access transistor of comparable drive strength in the OTP memory cell circuit.

22 Claims, 12 Drawing Sheets

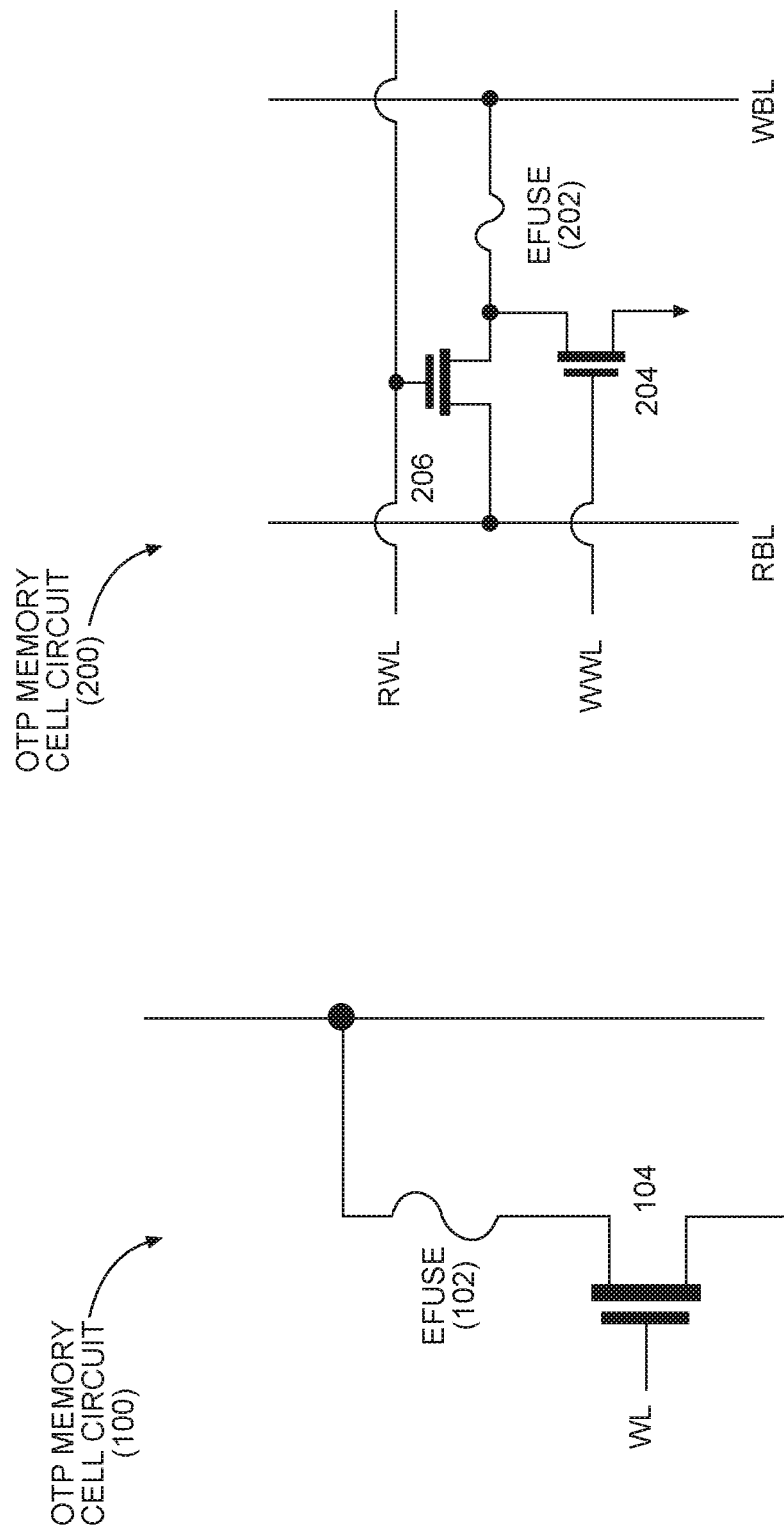

ONE-TIME PROGRAMMABLE (OTP) MEMORY CELL CIRCUITS EMPLOYING A DIODE CIRCUIT FOR AREA REDUCTION, AND RELATED OTP MEMORY CELL ARRAY CIRCUITS AND METHODS

BACKGROUND

I. Field of the Disclosure

The field of the disclosure generally relates to non-volatile memory, and more particularly to one-time programmable (OTP) read-only memory in electronic devices.

II. Background

Microprocessors and other processing circuits ("processors") process program instructions and data that are in a digital format, such as binary form. The instructions and data are read from memory elements, or memory cells, which store individual "bits" of binary data. Binary memory cells are set to maintain one of two physical states that are logically evaluated as "0" and "1", respectively. To program a processor to execute a different set of instructions, a binary memory cell can be changed by changing a physical state of the individual memory cells. Instructions and data may change frequently, and many types of digital memory cells are designed to have their state changed many times in response to programming, without any degradation in reliability.

However, for some applications, the data or instructions stored in a memory is not expected to change frequently or many times. For these applications, it is possible to use less expensive forms of memory that can eventually degrade with use, such as when their state has been changed more than a threshold number of times. For some memory applications, a memory cell is programmed with a value that will never change. For example, firmware, system settings, and/or security key information may be stored in a one-time programmable (OTP) memory that is programmed (written) once and accessed in a read-only mode thereafter. One type of OTP memory cell employs a circuit including a fuse (e.g., an electronic fuse or "efuse"), which is a conductive element that can be "blown" by passing a high current through the fuse for a period of time. An efuse has a different (e.g., higher) electrical resistance after it is blown, and that change in resistance is unidirectional (i.e., cannot be undone). A resistance of the blown state and a resistance of the not blown state are detectable when a voltage is applied in a read operation. The detected resistances may be used to represent binary values stored in the OTP memory cell circuit.

SUMMARY OF THE DISCLOSURE

Aspects disclosed herein include one-time programmable (OTP) memory cell circuits employing a diode circuit for area reduction. Related OTP memory cell array circuits employing such OTP memory cell circuits and methods of operation are also disclosed. A memory state of an OTP memory cell circuit depends on whether a conductive element (i.e., a fuse) is blown or not blown. The fuse is initially not blown in a first memory state. The OTP memory cell circuit is programmed to a second memory state by irreversibly blowing the fuse in a write operation. The write operation includes applying a write voltage to a write current path to generate a write current to blow the fuse. A transistor for controlling the write operation must be large enough to drive the write current.

In an exemplary OTP memory cell circuit, a read access switch is coupled to a fuse in a read current path and is controlled to allow a read current to flow through the fuse during a read operation and prevent current from flowing through the read access switch in a write operation. Providing a read access switch to control a read current path that is separate from the write current path reduces leakage currents that can occur during a read operation in an array of OTP memory cell circuits, which reduces unreliable results. The read access switch, which can be shut off in a write operation, is sized according to the read current and allows only a small leakage current, further improving reliability. In the exemplary OTP memory cell circuit, a diode circuit is coupled to a node between the read access switch and the fuse to provide a write current path through the fuse that is different from the read current path in the OTP memory cell circuit. The diode circuit is configured to drive, through the write current path including the fuse, a write current sufficient to blow the fuse in a write operation. The diode circuit occupies a smaller area than a write access transistor of comparable drive strength in the OTP memory cell circuit, as an example, to reduce the area of the OTP memory cell circuit. Bias voltages may be applied to the diode circuit to avoid current flow through the diode circuit during a read operation.

In this regard, in an exemplary aspect, an OTP memory cell circuit is disclosed. The OTP memory cell circuit comprises a fuse comprising a first terminal coupled to a node. The OTP memory cell circuit also comprises a read access switch comprising a first port coupled to the node. The OTP memory cell circuit also comprises a diode circuit comprising an anode coupled to the node.

In another exemplary aspect, an OTP memory cell array circuit is disclosed. The OTP memory cell array circuit comprises a two-dimensional (2D) array of OTP memory cells. The 2D array comprises a first row comprising a first plurality of OTP memory cells. The 2D array also comprises a second row comprising a second plurality of OTP memory cells. The 2D array also comprises a first column comprising a first OTP memory cell of the first plurality of OTP memory cells and a first OTP memory cell of the second plurality of OTP memory cells. The 2D array also comprises a second column comprising a second OTP memory cell of the first plurality of OTP memory cells and a second OTP memory cell of the second plurality of OTP memory cells. Each OTP memory cell of the first plurality of OTP memory cells and the second plurality of OTP memory cells comprises a fuse. The fuse comprises a first terminal coupled to a node. The fuse also comprises a second terminal. Each OTP memory cell also comprises a read access switch. The read access switch comprises a first port coupled to the node. The read access switch also comprises a second port. Each OTP memory cell also comprises a diode circuit. The diode circuit comprises an anode coupled to the node. The diode circuit also comprises a cathode. The OTP memory cell array circuit also comprises a first write bit line coupled to the second terminal of the fuse of each OTP memory cell in the first column of the 2D array. The OTP memory cell array circuit also comprises a second write bit line coupled to the second terminal of the fuse of each OTP memory cell in the second column of the 2D array. The OTP memory cell array circuit also comprises a first select line coupled to the cathode of the diode circuit in each OTP memory cell in the first row of the 2D array. The OTP memory cell array circuit also comprises a second select line coupled to the cathode of the diode circuit in each OTP memory cell in the second row of the 2D array.

In another exemplary aspect, a method of operating an OTP memory cell circuit is disclosed. The method comprises supplying a write voltage to a second terminal of a fuse. The fuse comprises a first terminal coupled to a node of the OTP memory cell circuit. The method also comprises supplying a select voltage to a cathode of a diode circuit. The diode circuit comprises an anode coupled to the node. The method also comprises supplying a first control signal to a control terminal of a read access switch. The read access switch comprises a first port coupled to the node, to deactivate current conduction through the read access switch from the first port to a second port. The method further comprises programming a memory state in the fuse by driving a write current in a write current path through the fuse in response to a first voltage difference between the write voltage and the select voltage.

BRIEF DESCRIPTION OF THE FIGURES

FIG. 1 is a schematic diagram of a one-time programmable (OTP) memory cell circuit in which a read path is the same as a write path;

FIG. 2 is a schematic diagram of an OTP memory cell circuit in which a first transistor provides a read path and a second transistor provides a write path;

DETAILED DESCRIPTION

Figure 3:
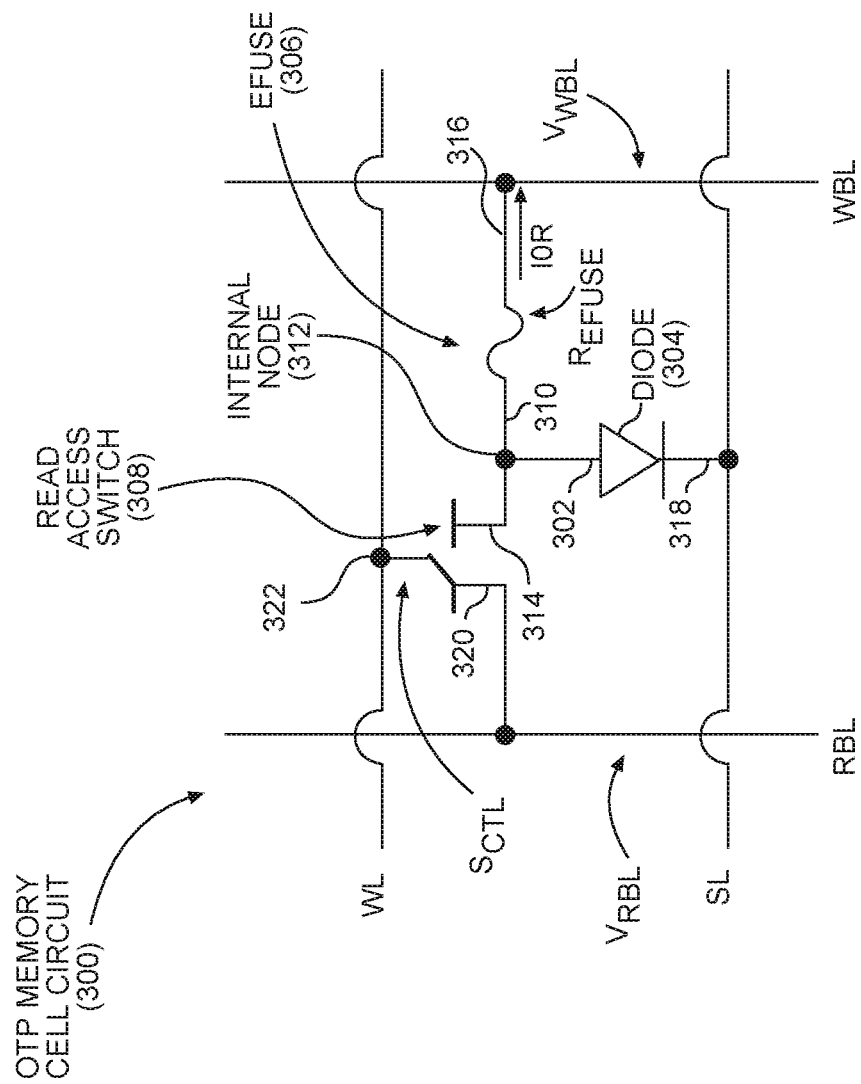
FIG. 3 is a schematic diagram of an exemplary OTP memory cell circuit in which an anode of a diode circuit is coupled to a fuse to provide a high-current path for programming the state of the fuse, and a small transistor provides a low-current, low-leakage path for reading the state of the fuse.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include one-time programmable (OTP) memory cell circuits employing a diode circuit for area reduction. Related OTP memory cell array circuits employing such OTP cell circuits and methods of operation are also disclosed. A memory state of an OTP memory cell circuit depends on whether a conductive element (i.e., a fuse) is blown or not blown. The fuse is initially not blown in a first memory state. The OTP memory cell circuit is programmed to a second memory state by irreversibly blowing the fuse in a write operation. The write operation includes applying a write voltage to a write current path to generate a write current to blow the fuse. A transistor for controlling the write operation must be large enough to drive the write current.

In an exemplary OTP memory cell circuit, a read access switch is coupled to a fuse in a read current path and is controlled to allow a read current to flow through the fuse during a read operation and prevent current from flowing through the read access switch in a write operation. Providing a read access switch to control a read current path that is separate from the write current path reduces leakage currents that can occur during a read operation in an array of OTP memory cell circuits, which reduces unreliable results. The read access switch, which can be shut off in a write operation, is sized according to the read current and allows only a small leakage current, further improving reliability. In the exemplary OTP memory cell circuit, a diode circuit is coupled to a node between the read access switch and the fuse to provide a write current path through the fuse that is different from the read current path in the OTP memory cell circuit. The diode circuit is configured to drive, through the write current path including the fuse, a write current sufficient to blow the fuse in a write operation. The diode circuit occupies a smaller area than a write access transistor of comparable drive strength in the OTP memory cell circuit, as an example, to reduce the area of the OTP memory cell circuit. Bias voltages may be applied to the diode circuit to avoid current flow through the diode circuit during a read operation.

OTP memory cells, also known as read-only memory cells, are programmed to store information that will not change. The programming may be based on a unidirectional change of a physical state of a device. In one example, the electrical resistance of a conductive element that is designed to become an open circuit or high resistance circuit in response to receiving a threshold current also known as a "fuse" is used to represent a binary value. One example of a fuse that can be employed for this purpose is an electronic fuse, known as an "efuse," but references to an efuse herein are not limited to a particular type of fuse or electronic fuse. A fuse, or efuse, is a conductor having a lower resistance when it is unblown and a higher resistance or no conductivity when it is blown. For example, a low resistance may correspond to a binary '0' and a high resistance may correspond to a binary '1', or vice versa. To change the electrical resistance of the efuse from a low resistance to a high resistance in a unidirectional operation, the efuse may be "blown" by driving a high current (e.g., 15 milliAmperes (mA)) through the efuse for a short period of time (e.g., at least 10 microseconds (µs)). A first example of an existing OTP memory cell circuit 100 based on an efuse is illustrated in FIG. 1, in which an electronic fuse (efuse) 102 is connected in series with a transistor 104. To program (write) or read the OTP memory cell circuit 100, the transistor 104 is turned on by a voltage on a write line (WL). In a write operation, a high current may be driven through the efuse 102 when a high voltage is applied to a bit line (BL). In a read operation, a lower voltage is applied to the BL and the current level through the efuse indicates the resistance of the efuse (i.e., whether the efuse is blown).

The high current of a write operation passes through both the efuse 102 and the transistor 104. Therefore, the transistor 104 must be large enough to have sufficient drive capabilities for the high current needed to blow the efuse 102. Such a large transistor suffers from a high leakage current, which occurs when a read voltage is applied to the shared BL but the transistor 104 is not turned on (e.g., 0 volts (V) applied to a write line (WL)). A transistor 104 that is large enough to drive the high current needed to program the OTP memory cell circuit 100 occupies a large amount of area in an integrated circuit (IC). In addition, the high leakage current of the transistor 104 can affect the accuracy of the read operations of other OTP memory cell circuits 100. Therefore, ICs including a high number of the OTP memory cell circuits 100 in FIG. 1 may be large, expensive, and unreliable.

In the OTP memory cell circuit 100 in FIG. 1, the read current path is the same as the write current path, which is through the transistor 104. An OTP memory cell circuit 200, as illustrated in FIG. 2, addresses the problem of inaccuracy of the OTP memory cell circuit 100 by including a separate transistor in a read path that is different from the write path. In the OTP memory cell circuit 200, one terminal of an efuse 202 is coupled to a large write transistor 204 and also to a read transistor 206. During a write operation, the write transistor 204 is turned on and the read transistor 206 is turned off, allowing the write current to pass through the efuse 202 and the write transistor 204 but not through the read transistor 206. During a read operation, the write transistor 204 is turned off and the read transistor 206 is turned on, allowing the read current to pass through the efuse 202 and the read transistor 206 but not through the write transistor 204. Since the current needed to determine a resistance of (i.e., to read) the efuse 202 is much smaller than the current required to blow (i.e., to write) the efuse 202, the drive strength and area of the read transistor 206 can be smaller than that of the write transistor 204. Consequently, the leakage current through the read transistor 206, when the OTP memory cell circuit 200 is not selected in a read operation, is much smaller than in the OTP memory cell circuit 100, which makes the reliability of the data read from the OTP memory cell circuit 200 greater than the reliability of the OTP memory cell circuit 100. However, the OTP memory cell circuit 200 still suffers from the problem of occupying a large area of an IC due to the large area of a write transistor 204 having sufficient drive strength to blow the efuse 202.

FIG. 3 is a schematic diagram of an exemplary OTP memory cell circuit 300 in which an anode 302 of a diode circuit 304 is coupled to a fuse 306 to provide a write current path for blowing (programming) the fuse 306, and a read access switch 308 provides a read current path for reading a state of the fuse 306. The fuse 306 may be an electronic fuse (efuse) and is subsequently referred to herein as an efuse 306. However, any other type of fuse having similar functionality is also within the scope of the present disclosure. In the OTP memory cell circuit 300, the diode circuit 304 provides the current driving strength needed to blow the efuse 306 in a much smaller area of an IC than (e.g., 10% of) the area of an IC occupied by a write transistor having the same drive strength. In consideration of the voltage drop of the efuse 306 and the diode circuit 304, the practical size (i.e., area) of a diode circuit 304 with an equivalent bias voltage is between 40% and 60% of the size of a write transistor used for the same purpose. Therefore, the size and cost of an IC can be reduced by employing the OTP memory cell circuit 300.

Another benefit of replacing a write transistor with the diode circuit 304 is an increase in reliability of a cell array in terms of high-voltage damage. A write transistor in the OTP memory cell circuit 200 in FIG. 2 is typically a regular voltage transistor whose maximum allowed gate voltage is about 1.2 V, but a supply voltage of about 1.8 V may be applied to a gate of the transistor in the program operation used to blow the efuse 202. Generally, the application of a voltage above the allowed maximum for a short period of time on a single occasion will not damage the write transistor, but damage due to the high voltage on the gate is possible and occurs in some instances. There is no comparable concern about damage to the diode circuit 304 when the efuse 306 is blown.

As shown in FIG. 3, the OTP memory cell circuit 300 includes the efuse 306 with a first terminal 310 coupled to an internal node 312. The OTP memory cell circuit 300 also includes the read access switch 308 with a first port 314 coupled to the internal node 312. In addition, the anode 302 of the diode circuit 304 is coupled to the internal node 312. The efuse 306 has a second terminal 316 coupled to a write bit line (WBL), and a cathode 318 of the diode circuit 304 is coupled to a select line (SL). A second port 320 of the read access switch 308 is coupled to a read bit line (RBL). The read access switch 308 may be a transistor, a micro-electromechanical device, or any type of three (3) terminal switch as known in the art in which one of the three terminals is a control terminal for controlling a switching operation and the control terminal controls current flow between the other two (2) terminals. In particular, a transistor employed as the read access switch 308 may be a field-effect transistor (FET), and more particularly a metal-oxide semiconductor (MOS) FET (MOSFET) of a P-type (PFET), in which a channel region of a semiconductor (e.g., silicon, not shown) is doped with a trivalent type material, or an N-type (NFET), in which the channel region is doped with a pentavalent type material. In an example in which the read access switch 308 is a MOSFET, a gate of the MOSFET is a control terminal of the read access switch 308, and a voltage supplied to the gate is a control signal to control the read access switch 308 to conduct a read current. Alternatively, a transistor employed as the read access switch can be a bi-polar junction transistor (BJT). In an example in which the read access switch 308 is a BJT, a base of the BJT is a control terminal of the read access switch 308, and a current supplied to the base is a control signal to control the read access switch 308 to conduct a read current. The term "coupled" as used herein indicates an electrical connection.

In an OTP memory cell circuit 300, in an example in which the read access switch 308 comprises a FET, the first port 314 may be a source region or a drain region ("first source/drain region") at a first end of a channel region and the second port 320 may be a drain region or a source region ("second source/drain region") coupled to a second end of the channel region. The diode circuit 304 may be implemented as a discrete diode 304 in which a PN junction (not shown) is formed by a first P-type region of a P-type material and a first N-type region of an N-type material. In case the read access switch 308 is implemented as a FET separate from the diode 304, the FET comprises at least a second P-type region of a P-type material and a second N-type region of an N-type material.

The efuse 306 is a conductive device configured to change from a lower resistance to a higher resistance when a sufficiently high current is conducted in the write current path through the efuse 306 (e.g., from the second terminal 316 to the first terminal 310) for a sufficient period of time. As an example, a current of between 15 mA and 19 mA for a period of 10 µs may be sufficient to blow the efuse 306 to change a resistance $R_{EFUSE}$. When the efuse 306 has been blown, the resistance $R_{EFUSE}$ is much higher than before the efuse 306 is blown. This change in resistance is irreversible. An efuse 306 that has not been blown may be interpreted as a binary '0' and an efuse 306 that has been blown may be interpreted as a binary '1'. However, a blown efuse 306 may instead be interpreted as a binary '0' and a not blown efuse 306 may be interpreted as a binary '1'.

To read the value of the OTP memory cell circuit 300, the read access switch 308 is turned on by providing a control signal to a control terminal of the read access switch 308. In response to a control signal $S_{CTL}$ supplied to a control terminal 322 of the read access switch 308 and a difference between a voltage $V_{RBL}$ on the RBL and a voltage $V_{WBL}$ on the WBL, the read access switch 308 conducts the read current I0R that flows from the RBL to the internal node 312, from the first terminal 310 to the second terminal 316, and into the WBL. A level of the read current I0R through the efuse 306 is measured to determine the resistance $R_{EFUSE}$. As described above, the resistance $R_{EFUSE}$ indicates one of the two binary states of the OTP memory cell circuit 300. Read and write operations of the OTP memory cell circuit 300 are described in further detail below with reference to FIGS. 4-7.

Figure 4:
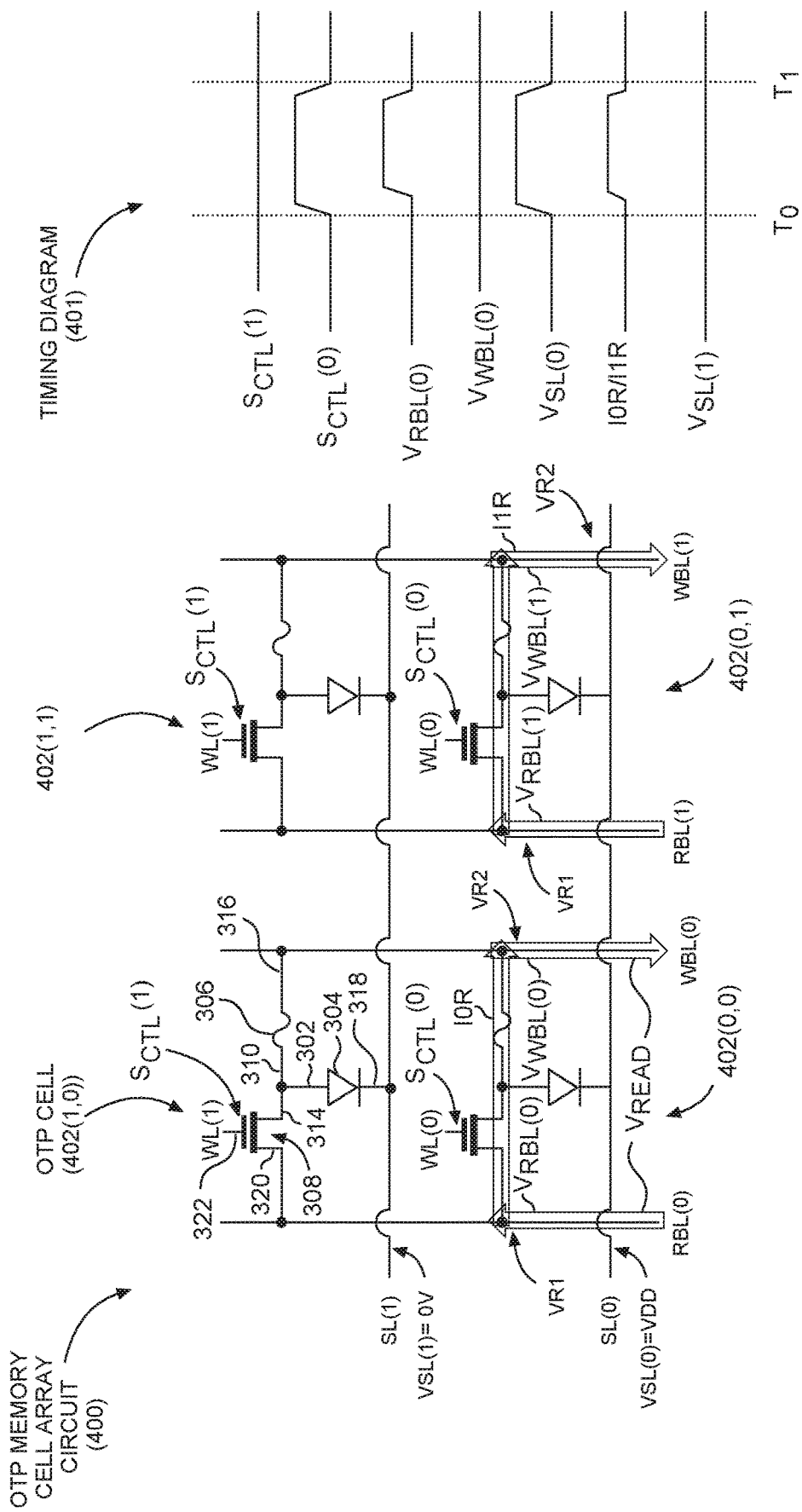
FIG. 4 is a schematic diagram of an OTP memory cell array circuit including a 2×2 array of OTP memory cell circuits, which includes a timing diagram of voltage levels in a first example of a read operation, and highlights a read current path.

FIG. 4 is a schematic diagram of an OTP memory cell array circuit 400 including a 2×2 array of OTP memory cell circuits 300. Henceforth herein, the OTP memory cell circuits 300 may also be referred to as "OTP cells 402." Similarly, the OTP memory cell array circuit 400 may also henceforth be referred to herein as "OTP array 400." FIG. 4 includes a timing diagram 401 of voltage levels in a first example of a read operation and illustrates the read current I0R through the OTP array 400. Features of the OTP cells 402 in FIGS. 4-7 that correspond to features of the OTP memory cell circuit 300 in FIG. 3 will be referred by the same labels or numbers as shown in FIG. 3 but such labels are not shown in FIGS. 4-7 to improve readability. In addition, in the examples in FIGS. 4-7, the read access switch 308 is implemented as a FET. Thus, the read access switch 308 is referred to in the descriptions of FIGS. 4-7 as a read access transistor 308, the first port 314 is referred to as the first source/drain 314, the second port 320 is referred to as the second source/drain 320, and the control terminal is referred to as a gate 322. The OTP array 400 is not limited to being a 2×2 array as shown here and may be an array of N×M OTP cells 402, where N and M are integers. In this example, RBL(0) and WBL(0) are coupled to each of the OTP cells 402 in column 0 of the OTP array 400, and RBL(1) and WBL(1) are coupled to each of the OTP cells 402 in column 1. Similarly, SL(0) and WL(0) are coupled to each of the OTP cells 402 in row 0 of the OTP array 400, and SL(1) and WL(1) are coupled to each of the OTP cells 402 in row 1.

During a read operation, a first read voltage VR1 is supplied as voltage VRBL(0) to the RBL(0) and VRBL(1) to the RBL(1). A second read voltage VR2 is supplied as voltage VWBL(0) to the WBL(0) and VWBL(1) to the WBL(1). The WL(0) in row 0, which is selected for reading, supplies a high gate voltage $S_{CTL}(0)$ to the gates 322 of the read access transistors 308 in each of the OTP cells 402 in row 0 to allow those transistors 308 to conduct a read current based on a voltage difference $V_{READ}$ between VR1 on the RBL and VR2 on the WBL. WL(1) supplies a low-level voltage as the control signal $S_{CTL}(1)$ to keep the transistors 308 in row 1 turned off. That is, the read access transistors 308 in row 0 of the OTP array 400 are configured to be activated by the control signal $S_{CTL}(0)$ on the WL(0) to conduct the read current I0R in a read current path from the first terminal 310 of the efuse 306 to the second terminal 316 of the fuse 306 in response to the voltage difference $V_{READ}$ between a first read voltage VR1 on the RBL(0) and RBL(1) and a second read voltage VR2 on the WBL(0) and WBL(1).

In the rows that are not selected (i.e., a low voltage is supplied as the control signal $S_{CTL}(1)$ to the gates 322), the read access transistor 308 within an OTP cell 402 remains turned off but the voltage across the read access transistor 308 during the read operation creates a leakage current through the read access transistor 308. Since the read access transistor 308 only needs to drive the small read current I0R to read the OTP cell 402, the drive strength of the read access transistor 308 is small and has a correspondingly small leakage current.

The OTP cell 402 employs the diode circuit 304 instead of a transistor for conducting current during a write operation. A transistor, such as the transistor 204 in FIG. 2, can be shut off during a read operation by applying a low gate voltage, but the diode circuit 304 is not controlled by a gate voltage. Thus, the diode circuit 304 must be shut off during a read operation in a different manner. In this regard, the diode circuit 304 may be reverse biased during the read operation. In the read operation discussed with reference to FIG. 4, the diode circuit 304 is reverse biased by a high bias voltage applied to the cathode 318 by the select line (SL). Alternatively, the diode circuit 304 may be weakly forward biased by a low bias voltage on the cathode 318, as discussed with reference to FIG. 5.

Details of a first example of a read operation are now discussed with continued reference to FIG. 4, in which the read currents I0R of OTP cell 402(0,0) and I1R of OTP cell 402(0,1) are highlighted. In this example, the diode circuits 304 in row 0 of the OTP array 400 are strongly reverse biased by supplying a select voltage VSL(0) of VDD (e.g., 1.8 V) to the SL(0) coupled to the cathode 318. Since current flow in the diode circuit 304 is unidirectional from the anode 302 to the cathode 318 and requires a positive voltage of approximately 0.6 to 0.7 V from the anode 302 to the cathode 318 to enable the unidirectional current flow, applying the select voltage VSL(0) of VDD to the cathode 318 effectively shuts off the diode circuits 304 in row 0 and prevents the currents I0R and I1R from flowing through the diode circuit 304 during the read operation.

To generate the read currents I0R and I1R, the first read voltage VR1 is applied to RBL(0) and RBL(1), and the second read voltage VR2 is applied to WBL(0) and WBL(1). A read current I0R through the OTP cell 402(0,0) depends on the voltage difference $V_{READ}$ between the first read voltage VR1 and the second read voltage VR2. Since the read current I0R passes through only the read access transistor 308 and the efuse 306, the read current I0R depends on a combined resistance of a resistance $R_{TRAN}$ of the read access transistor 308 and the resistance $R_{EFUSE}$ of the efuse 306. Therefore, the read current I0R can be determined by the equation: $I0R = V_{READ}/(R_{TRAN} + R_{EFUSE})$.

As highlighted in FIG. 4, the path of the read current I0R in the OTP cell 402(0,0) flows from the RBL(0) into the second source/drain 320 of the read access transistor 308, through the read access transistor 308, from the first source/drain 314 of the read access transistor 308 to the first terminal 310 of the efuse 306, and into the WBL(0) through the second terminal 316 of the efuse 306. Similarly, the highlighted path of the read current I1R in the OTP cell 402(0,1) flows from the RBL(1) into the second source/drain 320 of the read access transistor 308, through the read access transistor 308, from the first source/drain 314 of the read access transistor 308 to the first terminal 310 of the efuse 306, and into the WBL(1) through the second terminal 316 of the efuse 306.

Referring to the timing diagram 401 of voltage levels for a read operation illustrated in FIG. 4, prior to the read operation (e.g., prior to time $T_0$), the voltages on all signals are at a low level (e.g., ground, 0 V, VSS). To perform the read operation between time $T_0$ and time $T_1$, the read access transistors 308 are turned on by supplying a high voltage as the control signal $S_{CTL}(0)$ to the gates 322 on WL(0), and the diode circuits 304 are shut off by being strongly reverse biased with select voltages VSL(0) and VSL(1). The voltage difference $V_{READ}$ is applied to the OTP cells 402 in row 0 by supplying the first read voltage VR1 to the RBL(0) and RBL(1) and supplying a lower voltage (e.g., 0 V) as the second read voltage VR2 to the WBL(0) and the WBL(1). In response to a difference between VR1 and VR2, the read current I0R flows through the read access transistor 308 and the efuse 306. A level of the read current I0R is measured by a sense amplifier (not shown) on RBL(0) to determine the binary value (i.e., whether the efuse 306 is blown or not blown) of OTP cell 402(0,0), and a level of the read current I1R is measured on RBL(1) to determine the binary value (i.e., whether the efuse 306 is blown or not blown) of OTP cell 402(0,1). When the read operation is complete (at time $T_1$), the voltage levels of all signals may be returned to the low level.

Figure 5:
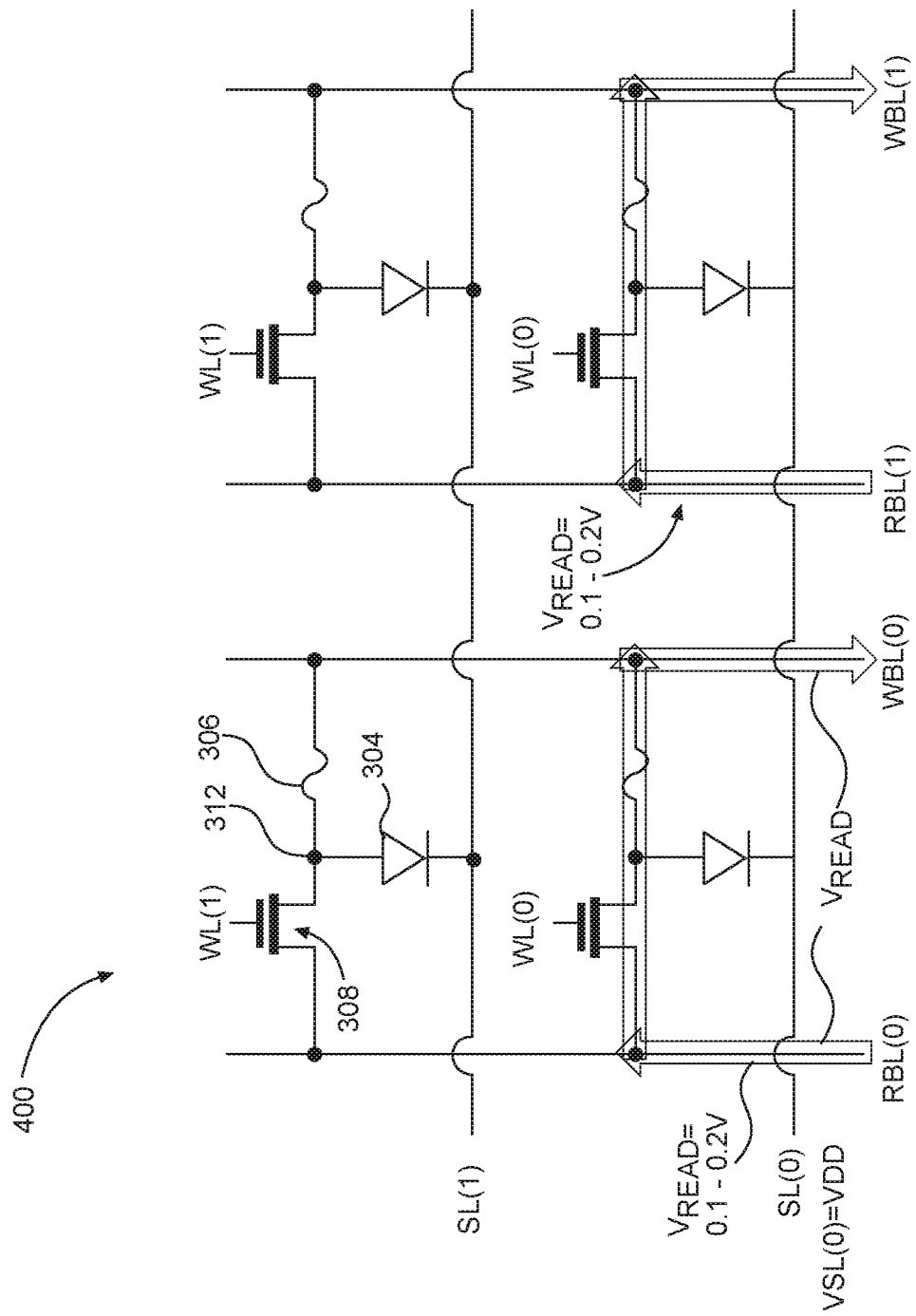
FIG. 5 is a schematic diagram of the OTP memory cell array circuit in FIG. 4 illustrating a second example of the read operation and highlights the read current path.

A voltage level of $V_{READ}$ in a read operation is set sufficiently low that an unblown efuse 306 will not be blown by the read current of one or more read operations and is set high enough to enable unambiguous detection of a difference between a blown state and an unblown state. FIG. 5 is a schematic diagram of the OTP array 400 illustrating another example of a read operation. In the example in FIG. 5, the voltage level of $V_{READ}$ is set in a range from 0.1 V to 0.2 V, which will not blow an unblown efuse 306 and generates sufficient read current I0R. The $V_{READ}$ in this range provides a voltage of less than 0.2 V at the internal node 312 and on the anode 302 of the diode circuit 304, which causes a weak forward bias of the diode circuit 304. Driving a current through the diode circuit 304 requires a forward bias of about 0.6 to 0.7 V. Thus, if the select voltage VSL(0) applied to the cathode 318 is ground (i.e., 0 V), the PN junction between the anode 302 and the cathode 318 will not have a sufficient forward bias voltage to drive a forward current. Biasing the diode circuit 304 in this manner requires less power for a read operation than the high voltage VSL(0) employed in a read operation in FIG. 4. Using the biasing method of FIG. 5, a small leakage current may pass through the diode circuit 304 in the forward direction, which can have an effect on the measurement of I0R for determining the state of the OTP cell 402. Thus, the read operation in FIG. 5 has a lower reliability but also a lower level of power consumption than the read operation in FIG. 4. In all other regards, the read operation of the OTP array 400 in FIG. 5 is the same as the read operation in FIG. 4.

Figure 6:
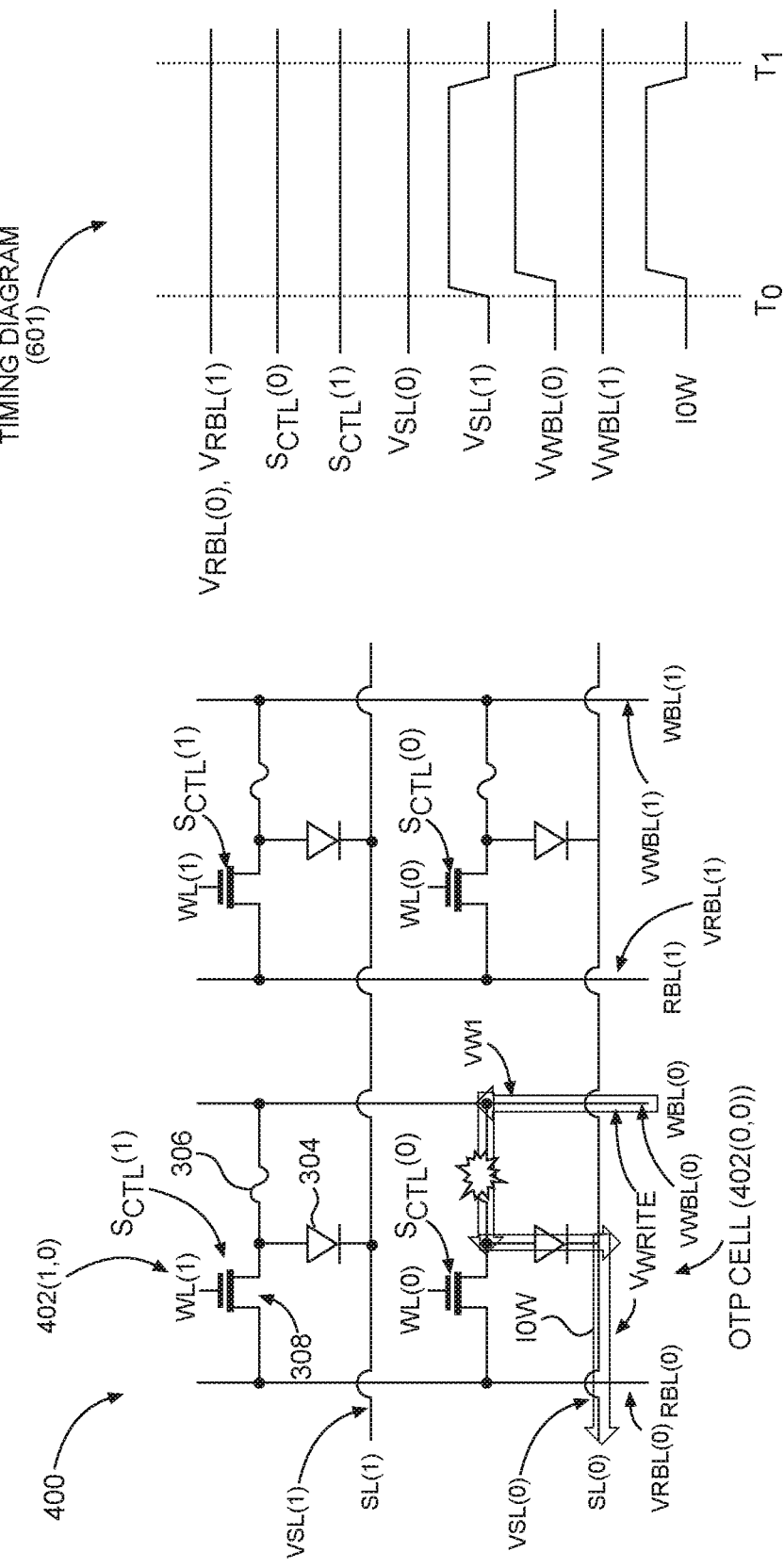
FIG. 6 is a schematic diagram of the OTP memory cell array circuit in FIGS. 4 and 5 including a timing diagram of voltage levels in a first example of a write operation, and highlights a write current path.

FIG. 6 is a schematic diagram of the OTP array 400 in FIGS. 4 and 5 illustrating a write operation used to blow the efuse 306. FIG. 6 also includes a timing diagram 601 of voltage levels used in a write operation of the OTP cell 402(0,0) and illustrates a direction of a write current I0W. Prior to the write operation (i.e., at time $T_0$), all signals are supplied a low voltage level (e.g., ground, 0 V). Low voltage is supplied as control signals $S_{CTL}(0)$ and $S_{CTL}(1)$ to all the gates 322 throughout the write operation to keep the read access transistors 308 turned off. Only a small leakage current passes through the read access transistor 308. In an example, the write current I0W needed to blow a single efuse 306 is at least 15 mA maintained for at least 10 µs. To blow efuses 306 in more than one OTP cell 402 in a single write operation would require driving excessively high current on the signal traces in the OTP array 400. Therefore, only one efuse 306 in one OTP cell 402 is blown at a time in a write operation.

The OTP memory cell circuit 300 is configured to conduct the write current I0W in the write current path from the second terminal 316 of the efuse 306 to the first terminal 310 of the efuse 306 in response to a voltage difference $V_{WRITE}$ between a write voltage VW1 on the WBL and a select voltage VSL on the select line SL. To perform the write operation on the OTP cell 402(0,0), starting at time $T_0$, the write voltage VW1 is applied as VWBL(0) (e.g., 1.8 V) on the WBL(0) and the select voltage VSL(0) (e.g., 0 V) is provided on the SL(0). A voltage difference $V_{WRITE}$ between VW1 and VSL(0) drives a write current I0W from the WBL(0) and through the efuse 306, the internal node 312, and the diode circuit 304 to the SL(0) as highlighted in FIG. 6. After at least 10 milliseconds (ms), the efuse 306 is blown and the voltages of signals to the OTP array 400 can be returned to ground.

The WBL(0) is coupled to all OTP cells 402 in column 0, so the voltage VW1 supplied on WBL(0) is also supplied to the OTP cell 402(1,0). The voltage difference $V_{WRITE}$ is not applied to the OTP cell 402(1,0) because the select voltage VSL(1) on SL(1) is also set to the level of the write voltage VW1. The diode circuit 304 capable of driving the write current I0W is much smaller than a transistor of comparable drive strength, which reduces an area occupied by the OTP array 400 in an IC.

Figure 7:
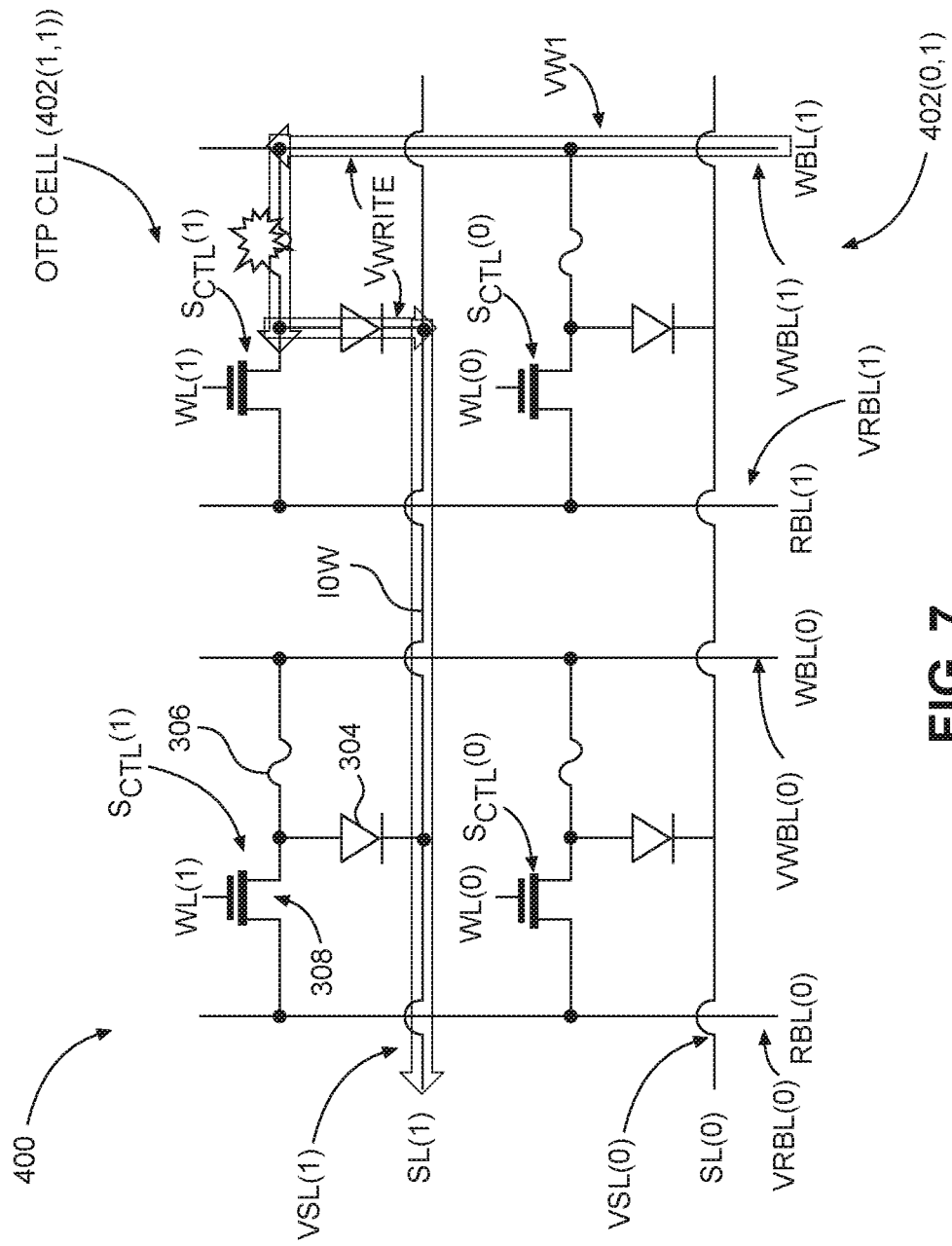
FIG. 7 is a schematic diagram of the OTP memory cell array circuit in FIGS. 4, 5, and 6 illustrating a second example of the write operation, and highlights the write current path.

FIG. 7 is a schematic diagram of the OTP array 400 in FIGS. 4-6 illustrating another example of a write operation to blow the efuse 306 in another OTP cell 402. In this example, the OTP cell 402(1,1) is blown. To do so, the write voltage VW1 (e.g., 1.8 V) is applied as VWBL(1) on the WBL(1) and a select voltage VSL(1) (e.g., 0 V) is supplied on the SL(1), which creates a voltage difference $V_{WRITE}$ to drive a write current I0W from the WBL(1) and through the efuse 306, the internal node 312, and the diode circuit 304 to the SL(1), as highlighted in FIG. 7. After at least 10 ms, the efuse 306 is blown and the voltages of signals to the OTP array 400 can be returned to ground. To prevent the efuse 306 in the OTP cell 402(0,1) from being blown, the select voltage VSL(0) is set equal to the write voltage VW1. The VRBL(0), VRBL(1), $S_{CTL}(0)$, and $S_{CTL}(1)$ are maintained at a low voltage throughout the write operation, as in FIG. 6.

Figure 8:
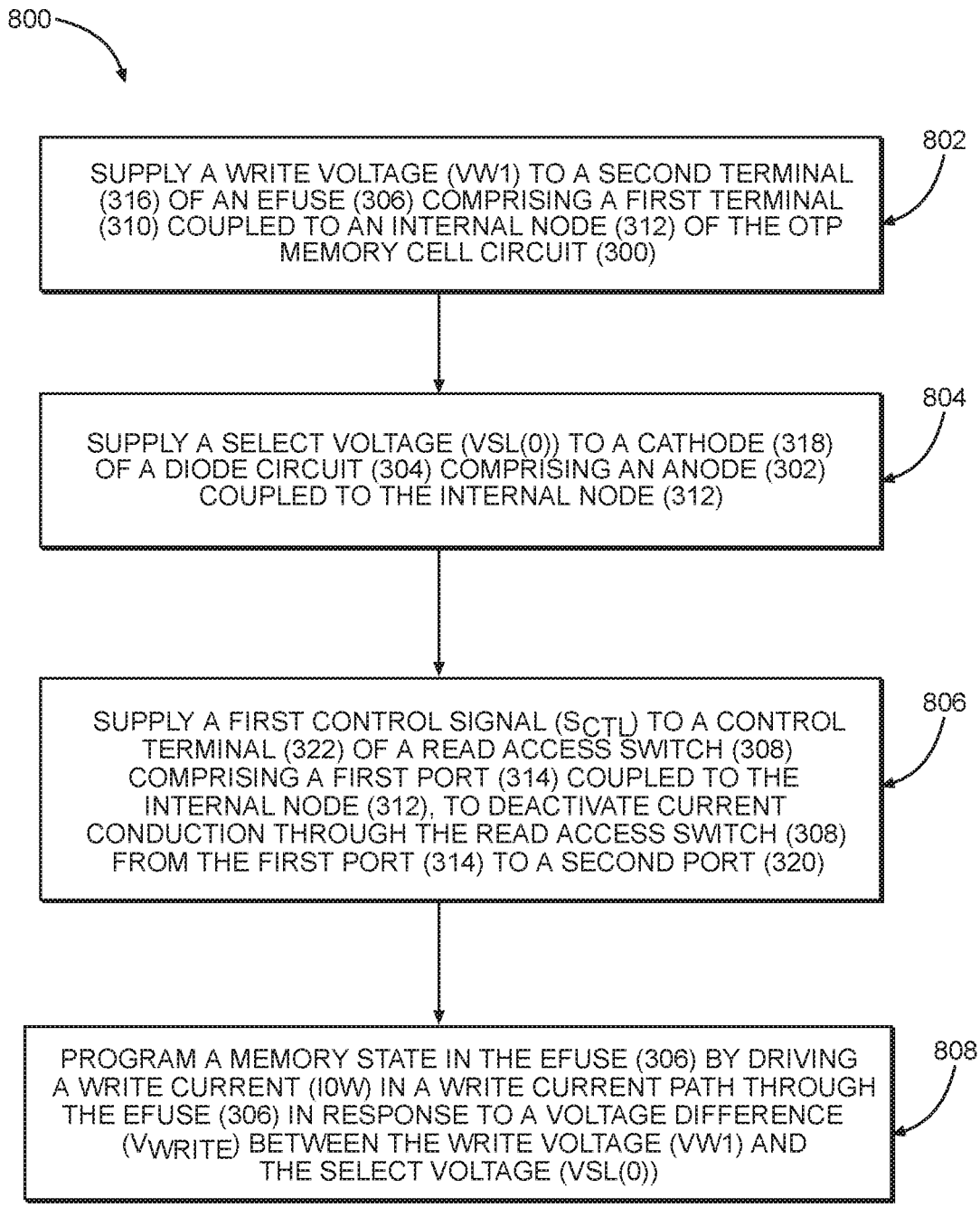
FIG. 8 is a flowchart illustrating a method of operating an OTP memory cell circuit as illustrated in FIG. 3.

FIG. 8 is a flowchart of a method 800 of operating the OTP memory cell circuit 300 in FIG. 3. The method 800 includes supplying a write voltage VW1 to a second terminal 316 of an efuse 306 comprising a first terminal 310 coupled to an internal node 312 of the OTP memory cell circuit 300 (block 802). The method 800 includes supplying a select voltage VSL(0) to a cathode 318 of a diode circuit 304 comprising an anode 302 coupled to the internal node 312 (block 804). The method 800 further includes supplying a first control signal $S_{CTL}$ to a control terminal 322 of a read access switch 308 comprising a first port 314 coupled to the internal node 312, to deactivate current conduction through the read access switch 308 from the first port 314 to a second port 320 (block 806). The method 800 also includes programming a memory state in the efuse 306 by driving a write current I0W in a write current path through the efuse 306 in response to a voltage difference $V_{WRITE}$ between the write voltage VW1 and the select voltage VSL(0) (block 808).

Figure 10:
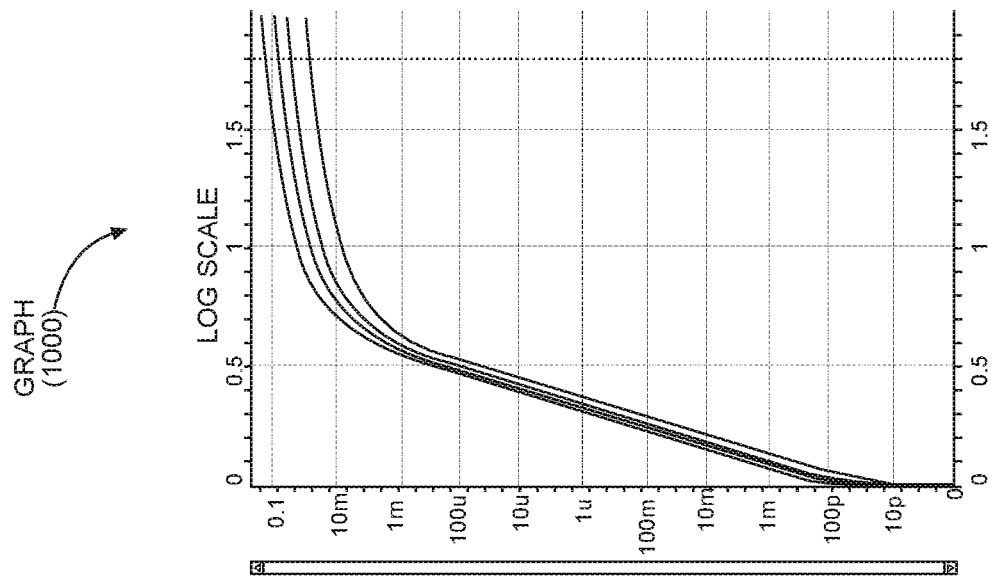
FIG. 10 is a graphical illustration in a logarithmic scale of simulations of currents through diode circuits of various sizes at 1.8 V and a temperature of 125° C.
Figure 9:
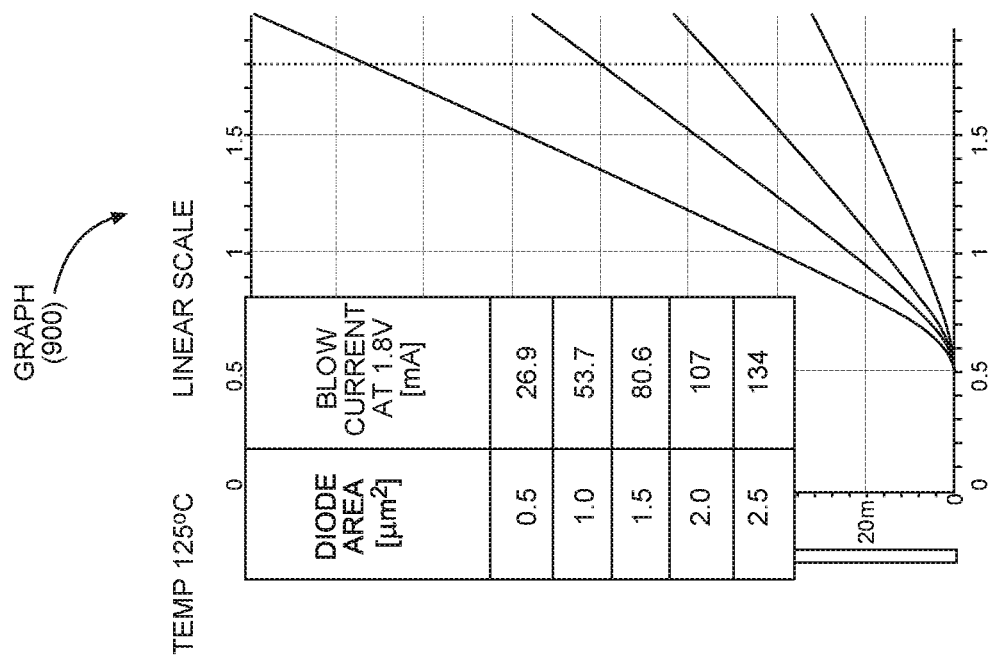
FIG. 9 is a graphical illustration in a linear scale of simulations of currents through diode circuits of various sizes at 1.8 volts (V) and a temperature of 125° C.

FIGS. 9 and 10 are graphical illustrations (graphs 900 and 1000), in a linear scale and a logarithmic scale, respectively, of simulations of currents through diodes of various sizes in response to an anode-to-cathode forward voltage bias of 1.8 V and a temperature of 125° C. Graphs 900 and 1000 are provided to show that a diode circuit having an area of 0.5 square microns ($\mu m^2$) can drive more current than is necessary (>15 mA) to blow a typical efuse. A transistor having an equivalent drive strength occupies much more area of an IC. In the example of a 4 nm technology, a transistor area of at least 2.5 $\mu m^2$ is required to drive the current necessary to blow a typical efuse. Thus, an OTP cell 402 is much smaller than previous OTP circuits in which a large transistor is employed in the write path.

Figure 11:
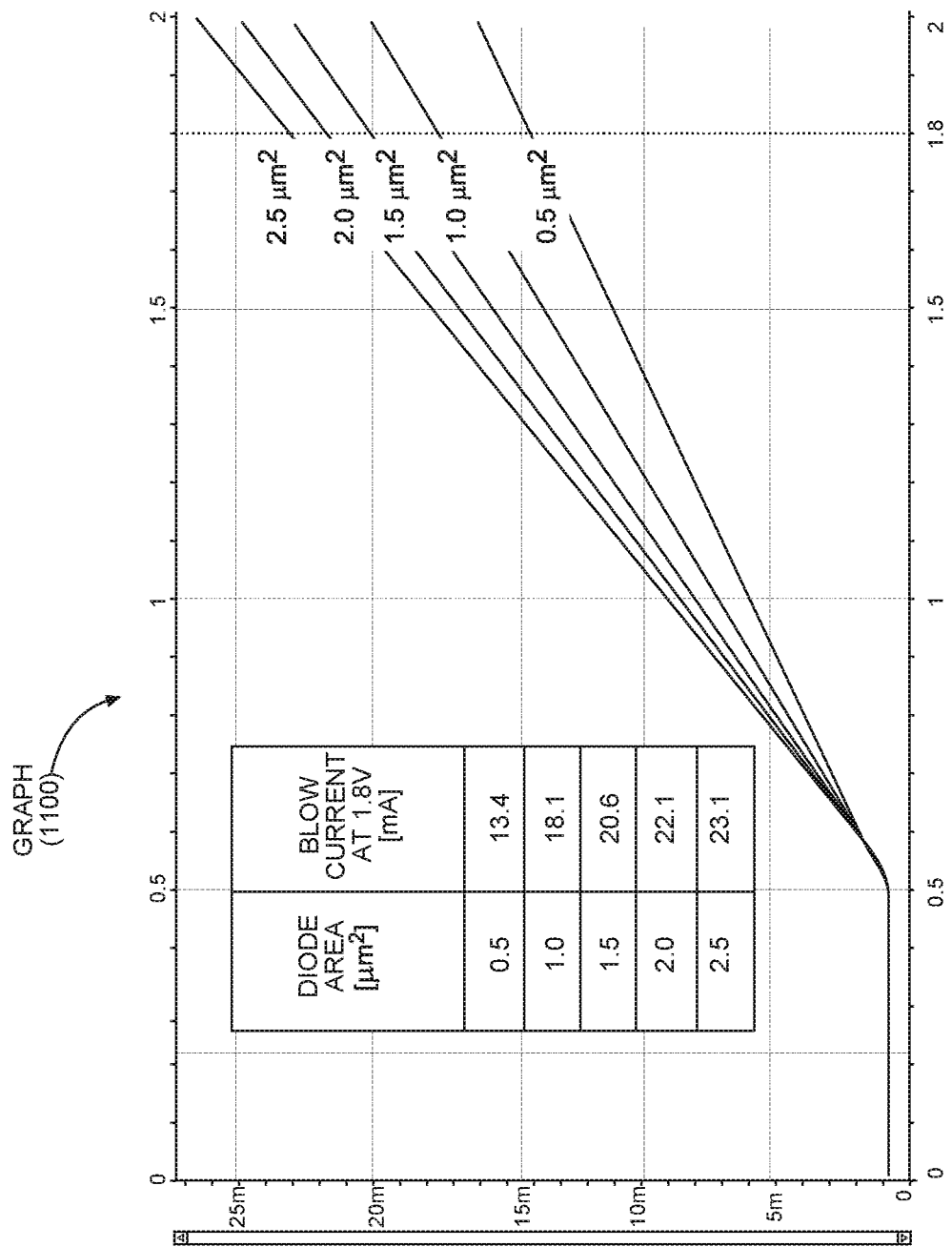
FIG. 11 is a graphical illustration in a linear scale of measured currents in OTP memory cell circuits including diode circuits of various sizes at 1.8 V and a temperature of 125° C.

FIG. 11 is a graphical illustration (graph 1100) in a linear scale of measured currents in OTP memory cell circuits, like the OTP memory cell circuit 300 illustrated in FIG. 3. The currents in FIG. 11 are in response to a voltage of 1.8 V supplied across a diode circuit 304 and an efuse 306 connected in series at a temperature of 125° C. The data illustrated in FIG. 11 is based on diode circuits of the same sizes used to generate the simulation data in FIG. 9. The data illustrated in FIG. 11 shows that the current in an OTP memory cell circuit 300 with a diode circuit having an area of 0.5 $\mu m^2$ is only 13.4 mA due to the resistance of the efuse 306 coupled in series with the diode circuit 304. FIG. 11 shows that, driving at least the 15 mA necessary to blow an efuse through a resistance of the efuse 306 in series with the diode circuit 304 requires a diode circuit having an area of more than 1.0 $\mu m^2$.

Figure 12:
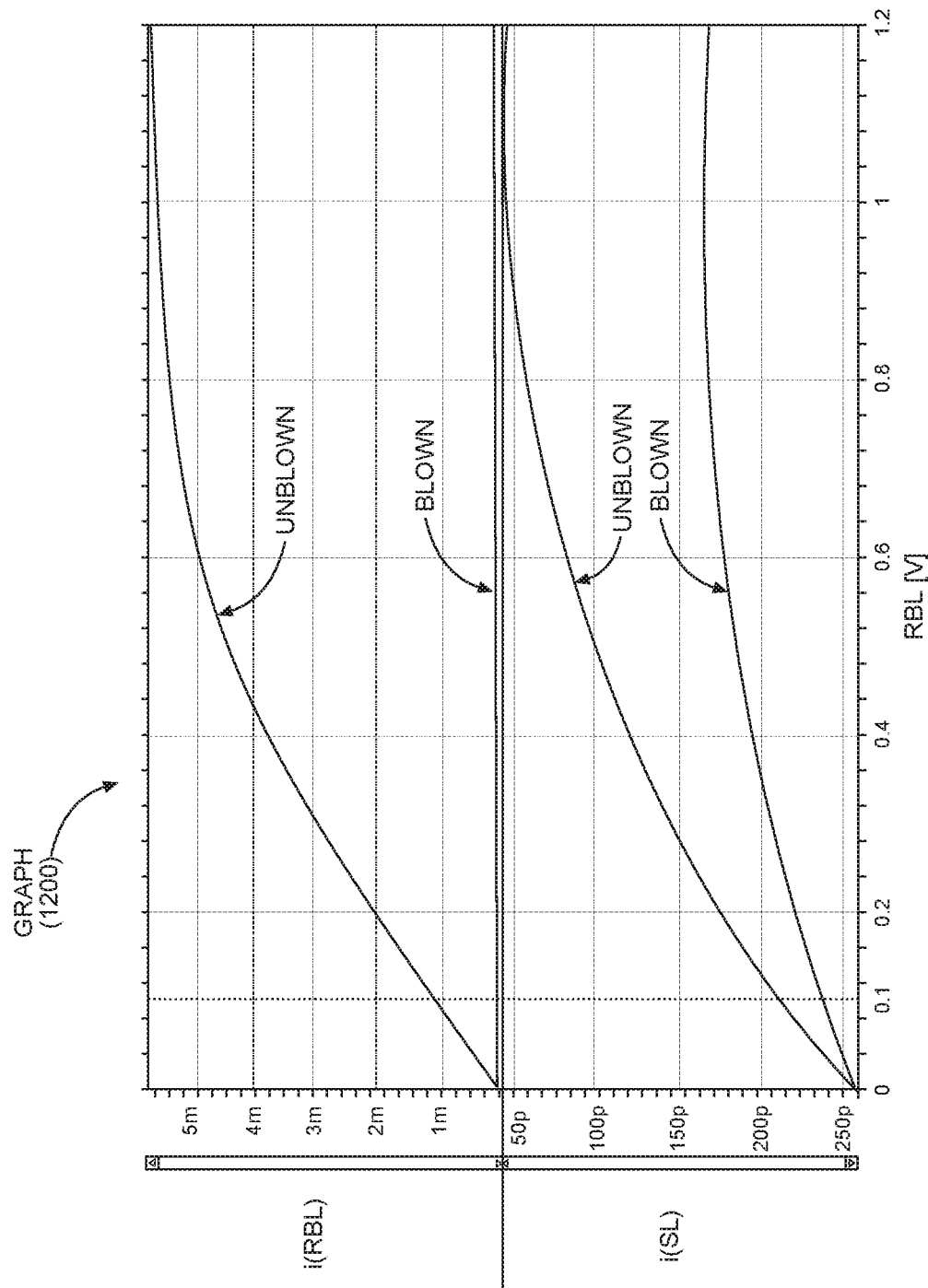
FIG. 12 is a graphical illustration for comparing read currents and leakage currents in OTP memory cell circuits with unblown fuses and blown fuses.

FIG. 12 is a graphical illustration (graph 1200) comparing read currents and leakage currents of OTP memory cell circuits with unblown efuses (low resistance) and blown efuses (high resistance). The read current I0R measured on the RBL when a voltage of 0.1 V is applied to the RBL is approximately 1 mA through an unblown efuse and is approximately 10 $\mu A$ through a blown efuse. As discussed above, the diode circuit 304 is reverse biased to shut off current flow through the diode circuit 304 during a read operation. However, a leakage current from the cathode 318 to the anode 302 occurs in the diode circuit 304 in response to the reverse bias. In an OTP cell 402 with an unblown efuse 306, the leakage current through the diode 304 in a read operation is 238 picoAmperes (pA) and, in an OTP cell 402 with a blown efuse 306, the leakage current through the diode circuit 304 is 213 pA. FIG. 12 shows that leakage currents through the diode circuit 304 are too small in comparison to the measured read currents to affect the reliability of read operations.

An OTP memory cell circuit such as that described in FIG. 3 and in the 2D OTP memory cell array circuits in FIGS. 4-7, employing a diode circuit providing a write path configured to drive the current necessary to program an efuse and occupying a smaller area than a transistor of comparable drive strength, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
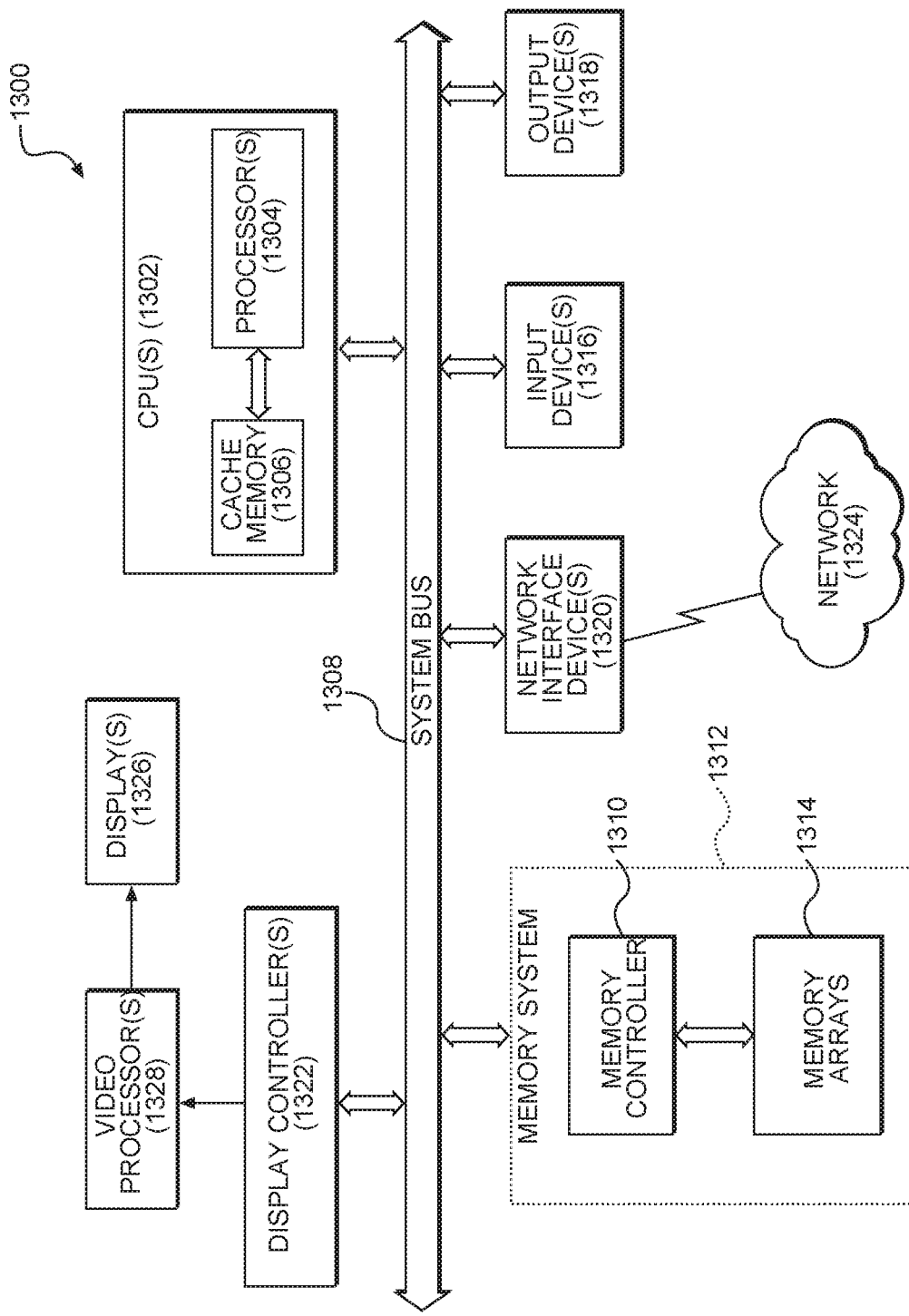
FIG. 13 is a block diagram of an exemplary processor-based system that can include an OTP memory cell circuit employing a diode circuit providing a write path capable of handling the high current necessary to blow the fuse and occupying a smaller area than would be needed for a transistor of comparable drive strength as in the OTP memory cell circuit in FIG. 3 and the 2D OTP memory cell array circuits in FIGS. 4-7.

In this regard, FIG. 13 illustrates an example of a processor-based system 1300 including an OTP memory cell circuit as the OTP memory cell circuit in FIG. 3 and the 2D OTP memory cell array circuits in FIGS. 4-7 employing a diode circuit providing a write path capable of handling the high current necessary to blow an efuse and occupying a smaller area than would be needed for a transistor of comparable drive strength. In this example, the processor-based system 1300 includes one or more central processor units (CPUs) 1302, which may also be referred to as CPU or processor cores, each including one or more processors 1304. The CPU(s) 1302 may have cache memory 1306 coupled to the processor(s) 1304 for rapid access to temporarily stored data. As an example, the processor(s) 1304 could include an OTP memory cell circuit employing a diode circuit providing a write path capable of handling the high current necessary to blow an efuse and occupying a smaller area than would be needed for a transistor of comparable drive strength as the OTP memory cell circuit in FIG. 3 and the 2D OTP memory cell array circuits in FIGS. 4-7, and according to any aspects disclosed herein. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312 that includes the memory controller 1310 and one or more memory arrays 1314, one or more input devices 1316, one or more output devices 1318, one or more network interface devices 1320, and one or more display controllers 1322, as examples. Each of the memory system 1312, the one or more input devices 1316, the one or more output devices 1318, the one or more network interface devices 1320, and the one or more display controllers 1322 can include an OTP memory cell circuit employing a diode circuit providing a write path capable of handling the high current necessary to blow an efuse and occupying a smaller area than would be needed for a transistor of comparable drive strength as the OTP memory cell circuit in FIG. 3 and the 2D OTP memory cell array circuits in FIGS. 4-7, and according to any aspects disclosed herein. The input device(s) 1316 can include any type of input device, including, but not limited to, input keys, switches, voice processors, etc. The output device(s) 1318 can include any type of output device, including, but not limited to, audio, video, other visual indicators, etc. The network interface device(s) 1320 can be any device configured to allow exchange of data to and from a network 1324. The network 1324 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1320 can be configured to support any type of communications protocol desired.

Figure 14:
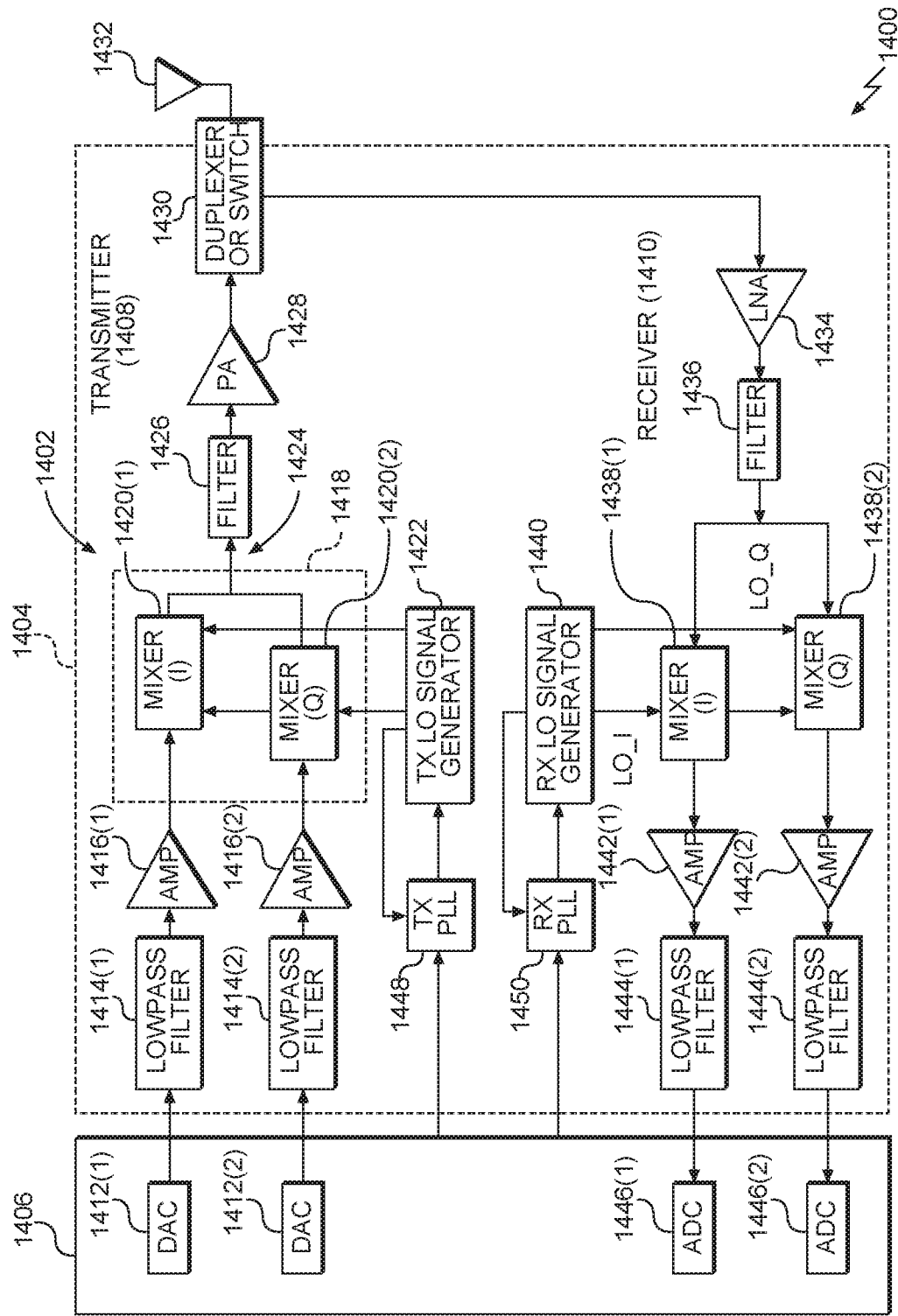
FIG. 14 is a block diagram of an exemplary wireless communications device that includes radio frequency (RF) components formed from a semiconductor chip package including an OTP memory cell circuit employing a diode circuit providing a write path capable of handling the high current necessary to blow a fuse and occupying a smaller area than would be needed for a transistor of comparable drive strength as in the OTP memory cell circuit in FIG. 3 and the 2D OTP memory cell array circuits in FIGS. 4-7.

The CPU(s) 1302 may also be configured to access the display controller(s) 1322 over the system bus 1308 to control information sent to one or more displays 1326. The display controller(s) 1322 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc. The display controller(s) 1322, display(s) 1326, and/or the video processor(s) 1328 can include an OTP memory cell circuit, as the OTP memory cell circuit in FIG. 3 and the 2D OTP memory cell array circuits in FIGS. 4-7, employing a diode circuit providing a write path capable of handling the high current necessary to blow an efuse and occupying a smaller area than would be needed for a transistor of comparable drive strength FIG. 14 illustrates an exemplary wireless communications device 1400 that includes radio frequency (RF) components formed from an integrated circuit (IC) 1402, wherein any of the components therein can include an OTP memory cell circuit as the OTP memory cell circuit in FIG. 3 and the 2D OTP memory cell array circuits in FIGS. 4-7, employing a diode circuit providing a write path capable of handling the high current necessary to blow an efuse and occupying a smaller area than would be needed for a transistor of comparable drive strength. The wireless communications device 1400 may include or be provided in any of the above-referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RF ICs (RFICs), mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMPs) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals from a TX LO signal generator 1422 through mixers 1420(1), 1420(2) to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmitted RF signal. The transmitted RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Down-conversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by AMPs 1442(1), 1442(2) and further filtered by lowpass filters 1444(1), 1444(2) to obtain I and Q analog input signals, which are provided to the data processor 1406. In this example, the data processor 1406 includes analog-to-digital converters (ADCs) 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency.

A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but, is to be accorded the widest scope consistent with the principles and novel features disclosed herein.

What is claimed is:

1. A one-time programmable (OTP) memory cell circuit, comprising:
   a fuse comprising:
      a first terminal coupled to a node; and
      a second terminal configured to couple to a write bit line;
   a read access switch comprising:
      a first port coupled to the node;
      a second port configured to couple to a read bit line; and
      a control terminal configured to couple to a word line; and
   a diode circuit comprising:
      an anode coupled to the node; and
      a cathode configured to couple to a select line;
   wherein, in response to a read operation:
      the read access switch is configured to:
         couple the read bit line to the node in response to a control signal provided to the word line; and
         receive a first read voltage on the read bit line higher than a second read voltage on the write bit line; and
      the cathode is further configured to receive a bias voltage on the select line to reverse bias the diode circuit.

2. The OTP memory cell circuit of claim 1, wherein:
   the diode circuit is configured to, in a write operation, form a write current path through the diode circuit between the write bit line and the select line; and
   the OTP memory cell circuit is configured to conduct a write current in the write current path from the second terminal of the fuse to the first terminal of the fuse in response to a first voltage difference between a write voltage on the write bit line and a first select voltage on the select line.

3. The OTP memory cell circuit of claim 2, wherein:
   in the read operation, the read access switch is configured to conduct a read current in a read current path from the first terminal of the fuse to the second terminal of the fuse in response to a second voltage difference between h first read voltage on the read bit line and the second read voltage on the write bit line.

4. The OTP memory cell circuit of claim 2, wherein the OTP memory cell circuit is further configured to conduct the write current in the write current path from the second terminal of the fuse to the first terminal of the fuse in response to the first voltage difference being between 1.75 volts (V) and 2.0 V.

5. The OTP memory cell circuit of claim 3, wherein the read access switch is further configured to be deactivated to decouple the read bit line from the fuse.

6. The OTP memory cell circuit of claim 3, wherein the read access switch is further configured to conduct the read current in the read current path from the read bit line to the first terminal of the fuse.

7. The OTP memory cell circuit of claim 3, wherein the read access switch is further configured to conduct the read current in the read current path from the first terminal of the fuse to the second terminal of the fuse in response to the second voltage difference between the first read voltage on the read bit line and the second read voltage on the write bit line being between 0.1 volts (V) and 0.2 V.

8. The OTP memory cell circuit of claim 3, wherein:
the read access switch further comprises a read access transistor;
the first port comprises a source/drain region; and
the second port comprises a drain/source region.

9. The OTP memory cell circuit of claim 1, wherein the diode circuit comprises a PN junction.

10. The OTP memory cell circuit of claim 1 integrated into an integrated circuit (IC).

11. The OTP memory cell circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. A one-time programmable (OTP) memory cell array circuit, comprising:
a two-dimensional (2D) array of OTP memory cells, the 2D array comprising:
a first row comprising a first plurality of OTP memory cells;
a second row comprising a second plurality of OTP memory cells;
a first column comprising a first OTP memory cell of the first plurality of OTP memory cells and a first OTP memory cell of the second plurality of OTP memory cells; and
a second column comprising a second OTP memory cell of the first plurality of OTP memory cells and a second OTP memory cell of the second plurality of OTP memory cells;
wherein each OTP memory cell of the first plurality of OTP memory cells and the second plurality of OTP memory cells comprises:
a fuse comprising:
a first terminal coupled to a node; and
a second terminal;
a read access switch comprising:
a first port coupled to the node;
a second port; and
a control terminal; and
a diode circuit comprising:
an anode coupled to the node; and
a cathode; and
wherein, in a read operation, in each of the first plurality of OTP memory cells and the second plurality of OTP memory cells:
the read access switch is configured to:
couple the second port to the node in response to a control signal provided to the control terminal; and
receive a first read voltage on the second port higher than a second read voltage on the second terminal of the fuse; and
the cathode of the diode circuit is configured to receive a bias voltage to reverse bias the diode circuit;
a first write bit line coupled to the second terminal of the fuse of each OTP memory cell in the first column of the 2D array;
a second write bit line coupled to the second terminal of the fuse of each OTP memory cell in the second column of the 2D array;
a first select line coupled to the cathode of the diode circuit in each OTP memory cell in the first row of the 2D array; and
a second select line coupled to the cathode of the diode circuit in each OTP memory cell in the second row of the 2D array.

13. The OTP memory cell array circuit of claim 12, wherein the OTP memory cell array circuit is configured to program a memory state in a target OTP memory cell of the 2D array by conducting a write current in a write current path from the second terminal of the fuse to the first terminal of the fuse in the target OTP memory cell in response to a first voltage difference between a write voltage on one of the first write bit line and the second write bit line coupled to the target OTP memory cell and a first select voltage on one of the first select line and the second select line coupled to the target OTP memory cell.

14. The OTP memory cell array circuit of claim 12, wherein the OTP memory cell array circuit is further configured to program the memory state in the target OTP memory cell by changing an electrical resistance of the fuse.

15. The OTP memory cell array circuit of claim 13, further comprising:
a first read bit line coupled to the second port of the read access switch of each OTP memory cell in the first column of the 2D array;
a second read bit line coupled to the second port of the read access switch of each OTP memory cell in the second column of the 2D array;
a first word line coupled to the control terminal of the read access switch of each OTP memory cell in the first row of the 2D array; and
a second word line coupled to the control terminal of the read access switch of each OTP memory cell in the second row of the 2D array.

16. The OTP memory cell array circuit of claim 15, wherein the OTP memory cell array circuit is configured to read the memory state of the target OTP memory cell of the 2D array by conducting a read current in a read current path from the first terminal of the fuse to the second terminal of the fuse in the target OTP memory cell in response to:
   the control signal on one of the first word line and the second word line coupled to the control terminal of the read access switch of the target OTP memory cell; and
   a second voltage difference between the first read voltage on one of the first read bit line and the second read bit line coupled to the target OTP memory cell and the second read voltage on one of the first write bit line and the second write bit line coupled to the target OTP memory cell.

17. The OTP memory cell array circuit of claim 12, wherein the fuse is an electronic fuse (efuse).

18. The OTP memory cell array circuit of claim 12 integrated into an integrated circuit (IC).

19. The OTP memory cell array circuit of claim 12 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

20. A method of operating a one-time programmable (OTP) memory cell circuit, the method comprising:
   supplying a write voltage to a second terminal of a fuse, the fuse comprising a first terminal coupled to a node of the OTP memory cell circuit;
   supplying a select voltage to a cathode of a diode circuit, the diode circuit comprising an anode coupled to the node;
   supplying a first control signal to a control terminal of a read access switch, the read access switch comprising a first port coupled to the node, to deactivate current conduction through the read access switch from the first port to a second port;
   programming a memory state in the fuse by driving a write current in a write current path through the fuse in response to a first voltage difference between the write voltage and the select voltage;
   supplying a first read voltage to the second port of the read access switch;
   supplying a second read voltage to the second terminal of the fuse;
   supplying a second control signal to the control terminal of the read access switch to control the read access switch to conduct a read current in a read current path through the read access switch from the second port to the first port and through the fuse in response to a second voltage difference between the first read voltage and the second read voltage;
   supplying a bias voltage to the cathode of the diode circuit to reverse bias the diode circuit;
   sensing the read current in the read current path; and
   determining a state of the OTP memory cell circuit based on the sensed read current.

21. The method of claim 20, wherein:
   the first voltage difference is between 1.75 volts (V) and 2.0 V; and
   the second voltage difference is between 0.1 V and 0.2 V.

22. The method of claim 20, wherein the bias voltage is between 1.75 volts (V) and 2.0 V.

* * * * *